(12) United States Patent
Gao

(10) Patent No.: US 11,399,448 B1
(45) Date of Patent: Jul. 26, 2022

(54) FULL SERVER LIQUID SYSTEM AUTO-CONNECTING DESIGN

(71) Applicant: BAIDU USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/185,764

(22) Filed: Feb. 25, 2021

(51) Int. Cl.
*H05K 7/20* (2006.01)

(52) U.S. Cl.
CPC ..... *H05K 7/20818* (2013.01); *H05K 7/20318* (2013.01); *H05K 7/20327* (2013.01)

(58) Field of Classification Search
CPC .......... H05K 7/20781; H05K 7/20772; H05K 7/20272; H05K 7/1489; H05K 7/20809; H05K 7/20254; H05K 7/20763; H05K 7/20736; H05K 7/20327; H05K 7/1487; H05K 7/20509; H05K 7/20263; H05K 7/1488; H05K 7/20281; H05K 7/20218; H05K 7/20872; G06F 1/20; G06F 1/16; G06F 1/184; H01L 23/473; H01L 23/46; F28F 9/0258; F28F 9/0256

USPC .......... 361/699, 679.53, 727, 701, 696, 724, 361/689, 698, 704, 725, 752, 715, 788, 361/679.32, 679.02, 756; 165/104.33, 165/80.4, 80.2, 80.5, 100, 168; 62/376, 62/310; 257/714

See application file for complete search history.

(56) References Cited

U.S. PATENT DOCUMENTS 10,571,635 B1 * 2/2020 Leigh ................. H04Q 11/0005

* cited by examiner

*Primary Examiner* — Mandeep S Buttar
(74) *Attorney, Agent, or Firm* — Womble Bond Dickinson (US) LLP

(57) ABSTRACT

A chassis can include a sliding liquid distributor that has blind mate connectors. The blind mate connectors mate with an IT rack in one direction and one or more electronic devices in an opposite direction. The liquid distributor circulates fluid to-and-from the electronic devices from-and-to the IT rack. Other embodiments are described and claimed.

20 Claims, 7 Drawing Sheets

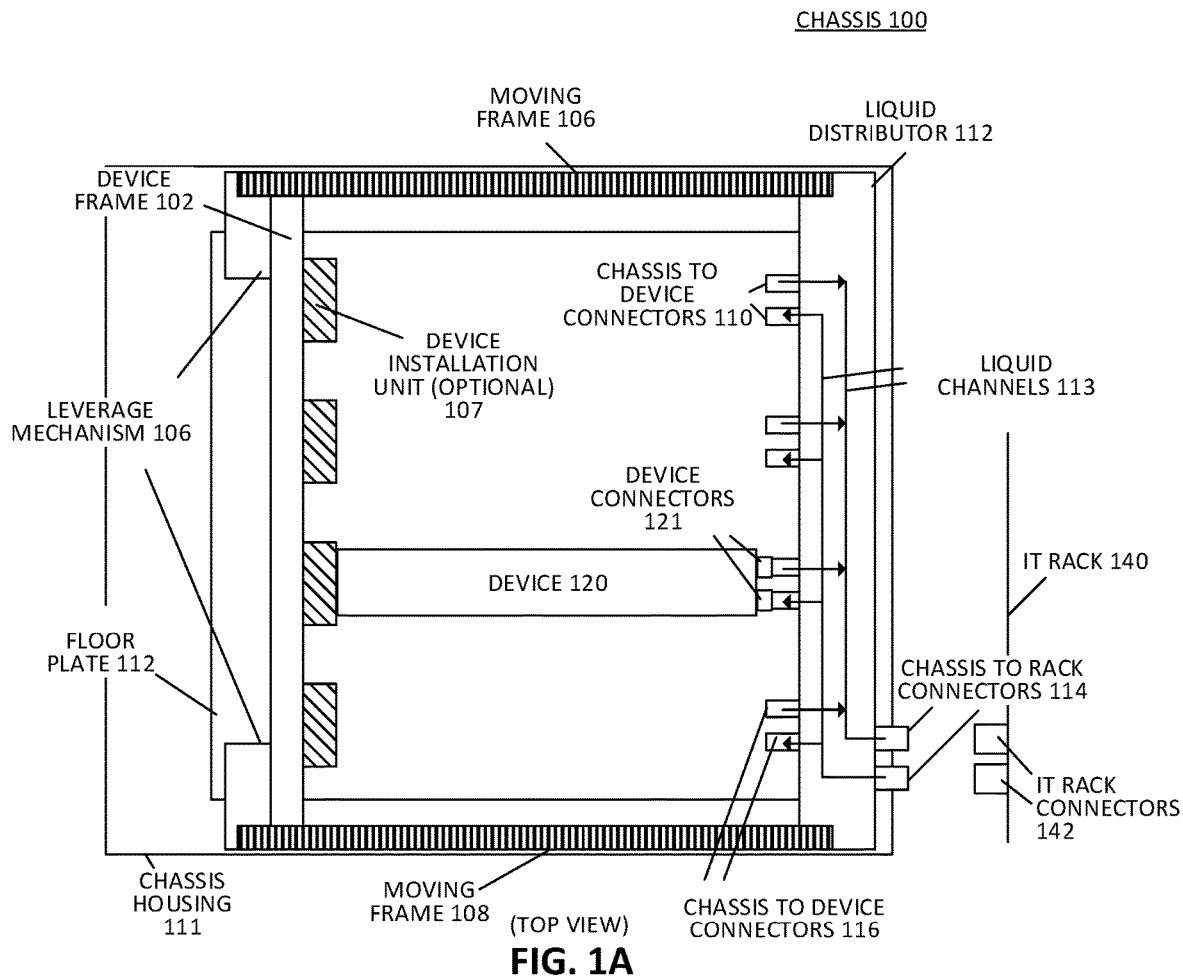
FIG. 1A (TOP VIEW)
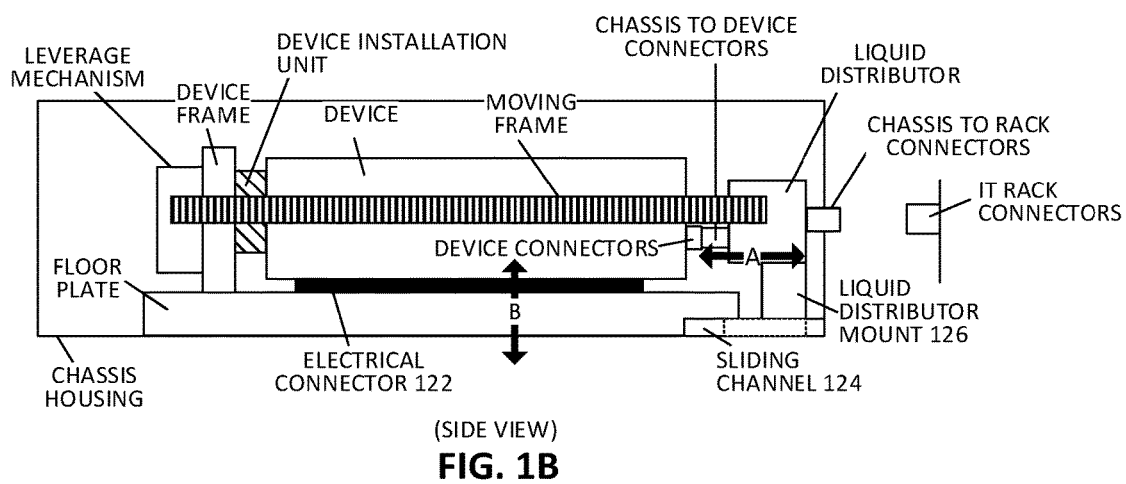
FIG. 1B (SIDE VIEW)

(TOP VIEW)

FULL SERVER LIQUID SYSTEM AUTO-CONNECTING DESIGN

FIELD

Embodiments of the present disclosure relate generally to a chassis that is installed in an information technology (IT) rack. In particular, the chassis can house liquid-cooled IT electronics (e.g., a server and/or peripheral devices) and include auto-connecting blind mate liquid connectors that reduce effort required to install the chassis to an IT rack.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These chassis can then be installed in an IT rack. An IT rack can be populated with a plurality of chassis as a manner of managing power and thermal requirements of the IT equipment.

A liquid cooling system transfers and delivers liquid between an IT rack and the chassis, and between the chassis and the IT equipment that is mounted on the chassis. Such a system can provide high operational and cooling efficiency of the IT equipment. Liquid cooling for high power density electronics has increased in popularity because air cooling can be thermally insufficient in some circumstances. Thus, there is a need for a liquid cooling solution for that supports various IT equipment, especially within the increasing power density packaged, while simultaneously addressing reliability, interoperability, serviceability and costs of liquid cooling.

It is critical to maintain the thermal environment that is required for various IT equipment (e.g., servers, power supplies, etc.). Management of thermal requirements can be especially important and challenging for a high power density rack, because if not cooled properly, an unacceptable amount of thermal energy can build up in a short amount of time and cause damage to the system. Further, a system should be low maintenance and highly reliable.

Printed circuit boards (PCBs) can be packaged with different system on chips (SOICs) such as, for example, GPU, ASIC, FPGA, Chiplet, and so on. Density of electronic packaging is increasing, as well as the work load performed by the IT equipment. Thus, there is a need to enable liquid cooling for these devices to manage an ever increasing amount of thermal energy generated by these devices.

The system may be designed to be able to assemble different numbers of peripheral devices to design for different configurations. The liquid cooling systems designed for this chassis should be able to accommodate these variations.

Blind-mating connectors reduce the effort in mating two connectors. There is a need, however, for integrating blind mate connectors into a chassis of an IT rack in a manner that reduces risk of damage to IT equipment and ensures proper connection. There is a lack of mature solutions for electronic devices and liquid-based blind mate connectors, such as those that use peripheral component interconnect express (PCI-E or PCIe) standard for connecting. As such, the design of a blind mating connection system for a server chassis that is populated with multiple numbers of liquid cooled devices is challenging.

Flexible hoses can present obstacles for maintenance, and increase risk of snagging and leaking. Further, connectors requiring manual twisting or turning of connectors to mate, which increases overall effort required to maintain the system, and could increase the risk of improper installation. Thus, there is a need for a chassis that does not include flexible hoses or manual liquid connections. In addition, designing the system with flexible hoses occupies additional space within the chassis which can limit the availability of a cooling solution and its interoperability and usability.

Another problem is that some electronic devices, such as PCI-E devices, may be used as peripheral devices, which means that the devices may not be permanently integrated with the main board. As such, a modular solution is needed that reduces the effort required to change out PCI-E devices to accommodate for varying application and/or workload requirements. In addition, some existing server level liquid cooling solutions are designed to mate with mezzanine connectors. These solutions, however, cannot be applied to PCI-E devices due to the limitations and difference of the form factors.

Therefore, there is a need for a liquid cooling system design such as a chassis that houses liquid cooled IT equipment that can address some of the issues described.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

FIG. 1A and FIG. 1B show an example chassis with liquid cooling in different views, according to some embodiments.

DETAILED DESCRIPTION

Figure 2:
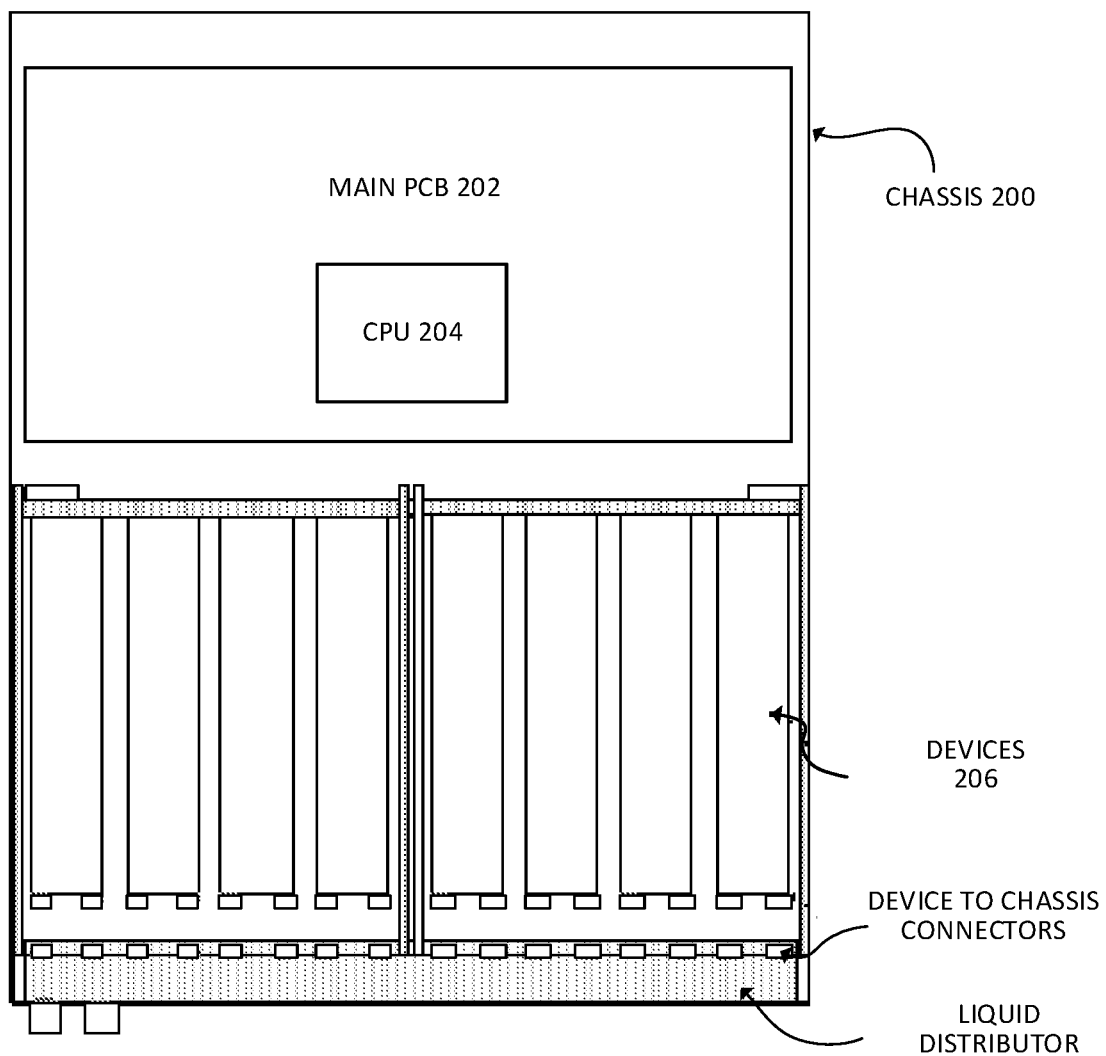
FIG. 2 shows an example chassis with liquid cooling for a main PCB and peripheral electronic devices, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

A liquid cooling solution is described in the present disclosure that includes blind mating connectors that connect with the cooling system of the IT rack and liquid cooling of one or more electronic device. Such an automatic blind mating design enables a highly efficient server level and device level operation, by eliminating presence of any flexible hoses. In addition, the solution provides a blind mating connection design for both the connections of the devices and serve chassis, and server chassis and racks. The blind mating connectors of the chassis can automatically mate with the rack cooling system and the electronic devices by pushing the chassis into a server slot in the IT rack. This can be performed without manual twisting and turning of connectors. It should be understood that, in the present disclosure, 'liquid' can be a 'fluid'. For example, in some embodiments, the liquid distributor can be a fluid distributor and the coolant can be a liquid, or a fluid that can also be a gas or a mixture of liquid and gas.

A system design for automatic fluid blind mating system is described for liquid cooling application. The chassis includes a two-tiered blind mating connection—a first set of blind mate connectors connects to rack-level fluid (e.g., an IT rack manifold), a second set of blind mate connectors connects to electronic devices (e.g., PCI-E devices). Blind mating connectors are integrated on the IT rack's fluid distribution manifold. A highly efficient and compact liquid distribution system of the chassis and IT rack minimizes the need for fluid hoses. In addition, multiple devices can be connected to rack level or system level cooling loops in a modular manner. The chassis design can support different form factors of devices, and protect electrical connections from forces that may be produced through mating of the liquid connections.

In one aspect, a chassis for packaging electronics to be populated on an IT rack include s a liquid distributor having first blind mate connectors facing a first direction and second blind mate connectors, facing away from the first direction, wherein the first blind mate connectors are to be coupled to a rack manifold of an electronic rack to receive cooling fluid, to distribute the cooling fluid to an electronic device via the second blind mate connectors, and to return the cooling fluid carrying heat generated from the electronic device back to the rack manifold. The chassis further includes a sliding channel of the chassis that the liquid distributor is mounted to, such that the liquid distributor slides back and forth along the first direction. The chassis further includes a device frame having a mounting slot to receive the electronic device deposited thereon, such that the second blind mate connectors slide towards the mounting slot when a first force is applied to the first blind mate connectors against the first direction.

In one embodiment, the chassis further includes a moving frame, fixed to the liquid distributor, that slides back and forth along the first direction due to corresponding movement of the liquid distributor; and a leverage mechanism that is fixed to the moving frame, that provides a second force against the device frame in response to the first force that is applied to the first blind mate connectors against the first direction.

In one embodiment, the leverage mechanism includes a first member fixed to the moving frame, a second member that is coupled to the first member, a fulcrum that interfaces with the second member to pivot the second member in response to the first force, to produce the second force. The first blind mate connectors and the second blind mate connectors are fluidly connected via two or more liquid channels. A first of the first blind mate connectors is fluidly connected to a first of the second blind mate connectors to distribute liquid from the first of the first blind mate connectors to the first of the second blind mate connectors. A second of the first blind mate connectors is fluidly connected to a second of the second blind mate connectors to return liquid from the second of the second blind mate connectors to the second of the first blind mate connectors. The chassis may be a hose-less liquid cooling chassis.

In one embodiment, each of the first blind mate connectors and each of the second blind mate connectors includes a guiding member and a locking member that mates each to a respective connector by applying force to the chassis in the first direction. The second blind mate connectors comprise a plurality of pairs of second blind mate connectors that are fluidly connected to the first blind mate connectors, and wherein the device frame includes a plurality of mounting slots for attaching a plurality of electronic devices. A first set of the plurality of pairs of second blind mate connectors and a first portion of the plurality of mounting slots form a first row, and a second set of the plurality of pairs of second blind mate connectors and a second portion of the plurality of mounting slots form a second row behind the first row. The electronic device is a PCIE device, and an electronic connector that is attached to the chassis mates to the PCIE device in a direction that is perpendicular to a mating direction of the first blind mate connectors and second blind mate connectors. The sliding channel includes rail, a channel, or a member that slides through the rail or the channel.

In another aspect, an electronic rack includes a rack manifold to receive and to return cooling fluid from and to an external cooling source. The electronic rack further includes a stack of server chassis, each server chassis containing one or more servers therein. Each server chassis include the components as described above.

FIG. 1A and FIG. 1B show an example chassis with liquid cooling according to some embodiments. The chassis can be populated with one or more liquid-cooled electronic devices (e.g., IT equipment) and then installed on an IT rack.

FIG. 1A shows the top view of the chassis. A chassis 100 houses one or more electronic devices 120. The electronic device can attach to a device frame 102 through a device installation unit 107, which can include one or more attaching members such as brackets, bolts, latches, nuts, clips, or other equivalent mechanical members. The device installation unit is optional, in that different mechanisms can be used to fix the device to the device frame of the chassis directly. The device frame can form a wall or surface that is perpendicular to a floor of the chassis. The electronic devices can be installed between the device frame and a liquid distributor 112.

The liquid distributor 112 acts as a chassis-level manifold that distributes liquid (e.g., a coolant) to and from the one or more electronic devices 120. The liquid distributor can have first blind mate connectors 114 that fluidly connect the liquid distributor to the IT rack (e.g., rack manifold). First blind mate connectors 114 include a supply connector to receive cooling fluid from the rack manifold and a return connector to return the cooling fluid carrying the heat generated from the heat generating components (e.g., processors) back to the rack manifold. The liquid distributor can have second blind mate connectors 110 that fluidly connect the liquid distributor to the electronic device (e.g., a cold plate attached to the electronic device). The first blind mate connectors and the second blind mate connectors are fluidly connected via two or more liquid channels 113. For example, a first of the first blind mate connectors is fluidly connected to a first of the second blind mate connectors to distribute liquid from the first of the first blind mate connectors to the first of the second blind mate connectors (e.g., to deliver fluid from the IT rack to the electronic device). Similarly, a second of the first blind mate connectors is fluidly connected to a second of the second blind mate connectors (e.g., to circulate liquid from the electronic device back to the IT rack). As such, the liquid distributor circulates cooling fluid to-and-from the electronic devices from-and-to the IT rack.

As shown in FIG. 1A and FIG. 1B, the first blind mate connectors can face a first direction (towards a mating connector in the IT rack, e.g., from frontend towards backend of the rack). In this example, the first direction refers to a direction from leverage mechanism 106 towards connectors 114. The second blind mate connectors face away in a second direction from the first direction (towards a mating connector of the device, e.g., from the backend towards the frontend of the rack). In this example, the second direction refers to a direction from connectors 114 towards leverage mechanism 106. The liquid distributor can be mounted to a sliding channel 124, such that the liquid distributor slides back and forth along the first direction (shown as direction 'A' in FIG. 1B). For example, the liquid distributor can be fixed to a mount 126 that offsets the liquid distributor from a floor plate 112 of the chassis. The floor plate 112 can be understood as a baseboard which is used for integrating multiple electronics devices 120, and providing the interconnection and communication, management and security. The liquid distribution mount 126 can connect to the sliding channel which is on the server chassis through sliding mechanisms such as, for example, a rail, a channel, and/or a member that slides through the rail or the channel. The server chassis can be a rigid frame structure that includes a bottom structure and/or side structures of the chassis, similar to a container. Different sliding mechanisms can be implemented that provide movement of the liquid distributor back and forth along the direction of the slide.

The device frame 102 includes one or more mounting slots for attaching one or more electronic devices (e.g., processors attached to corresponding cold plates). This mounting slot can be sandwiched between the device frame and the liquid distributor. The second blind mate connectors slide towards the mounting slot (and the attached electronic device) when a force is applied to the first blind mate connectors in a first direction (that is in line with the mating direction of the connectors). In other words, when a user pushes the chassis into a server slot of the IT rack, i.e., from the frontend on the left-hand side to backend on the right-hand side in this example, this causes the first blind mate connectors (e.g., connectors 114) to mate with the connectors of the rack manifold of the IT rack (e.g., connectors 142). Further, the IT rack pushes back against liquid distributor of the chassis, causing the liquid distributor and the second blind mate connectors to slide towards the respective electronic device (e.g., from right to left in this example), which causes the second blind mate connectors (e.g., connectors 110 and 116) to mate with the electronic device (e.g., connectors 121). The mating of the connectors can be performed without the need for turning the connectors. This installation process is described further in other sections.

In some embodiments, the blind mate connectors of the chassis have a sliding, snapping, and/or locking member that snaps and/or locks the connectors into place when a sufficient and proper pressure is applied (in the mating direction of the connectors) that presses the connectors together. The connectors can be arranged on the chassis as described so that the first and second connectors mate to respective connectors in response to the force being applied to the chassis when the chassis is pushed into a server slot in the IT rack.

In some embodiments, the connectors can have one or more aligning mechanisms (e.g., a guiding member such as a pin, groove, slot, etc.) that align the connectors to help them mate properly. Thus, based on the aligning and sliding/snapping, mating can be performed with minimal effort, without wrenches or other tools, and by simply pushing the chassis into the rack. In some embodiments, the connectors are dripless blind mating connectors to prevent any leaking of fluid.

In some embodiments, the chassis includes a moving frame (e.g., 106 and 108) that is fixed to the liquid distributor as well as transfer the force to the device frame 102 through the leverage structure 106. The moving frame can slide back and forth along the direction 'A' due to corresponding movement of the liquid distributor. The moving frame 108 can be fixed together with the liquid distributor 112 so that they move in unison. The moving frame can be mechanically coupled to the leverage mechanism 106, but the leverage mechanism does not slide back and forth in unison with the liquid distributor. The leverage mechanism 106 can be partially fixed to the moving frame. The leverage mechanism provides a second force against the device frame in response to the force (e.g., a first force) that is applied to the first blind mate connectors against the first direction. This second force helps push the electronic device (and blind mate connectors of the electronic device) into the second blind mate connectors, therefore providing additional mating pressure to help ensure proper mating of the blind mate connectors. This is further described in other sections, such as in relation to FIG. 6. Although shown at the edges of the chassis, the moving frame can also have one or more members located between the devices, however this implementation may result in larger space requirement and a cost increase. The moving frames can be arranged length-wise from the liquid distributor to the device frame. There can be two or more moving frames on the chassis, on both sides of the one or more electronic devices.

The chassis can include an electronics connector 122 that includes one or more pins or sockets that electrically connect the device to a bus (e.g., a PCI-E bus) and/or to other IT equipment (e.g., a main PCB). The electrical connector can mate to the device in a direction 'B' that is perpendicular to a mating direction (direction 'A') of the first blind mate connectors and the second blind mate connectors, as shown in FIG. 1B. Based on this arrangement, a force in the mating direction 'A' of the fluid connectors can cause damage to the electrical connector or pins in the electrical connector. Thus, the opposing force that is produced by the leverage mechanism 106 can protect the electronics connector and reduce risk of damage.

The moving frame as well as the device frame can be installed on the sides of the chassis housing 111. The moving frame is able to be moving during the operation along the horizontal direction (direction 'A') of FIG. 1A and FIG. 1B.

The device frame is fixed in place such as on the side of the chassis housing 111 and/or on the floor plate 112. As mentioned, one or more devices can attach and fix itself to the device frame. As such, one or more devices can be assembled to the chassis in respective locations.

It should be noted that, in some embodiments, the chassis does not include a hose for circulating fluid to or from the electronic devices. Rather, the fluid circulation is performed through the liquid distributor and the blind mate connectors, thereby reducing clutter and manual labor related to the hoses and increasing real estate for electronic devices.

FIG. 2 shows a top view with the system integrated to the chassis 200. A main printed circuit board (PCB) 202 can include a central processing unit (CPU) 204. The chassis includes positions for mounting multiple high performance, liquid cooled devices 206. The devices can be vertically installed to the chassis and electronically connected to the main PCB 202 through a PCI-E bus, as an example. The devices can be assembled to the device frame of the chassis, as described. In addition, the liquid distributor is mounted to a sliding channel, as described. As such, different liquid cooled peripheral devices can be connected to support the main PCB in a modular manner. The system is modular, allowing for different combinations of devices. Further, the connectivity of the liquid connections are simplified with the blind mate arrangement of the system, which reduces the manual effort required for installing or swapping the electronic devices.

The chassis can support a plurality of electronic devices, as shown in FIG. 1A, FIG. 1B, FIG. 2, and FIG. 3. As such, a plurality of pairs of second blind mate connectors (chassis to device connectors) can be fluidly connected to the first blind mate connectors (chassis to rack connectors) through one or more liquid distributors. In some embodiments, the plurality of devices can be arranged in a row (as shown in FIG. 1A, FIG. 1B, and FIG. 2). In some embodiments, the plurality of devices can be arranged in two or more rows.

Figure 3:
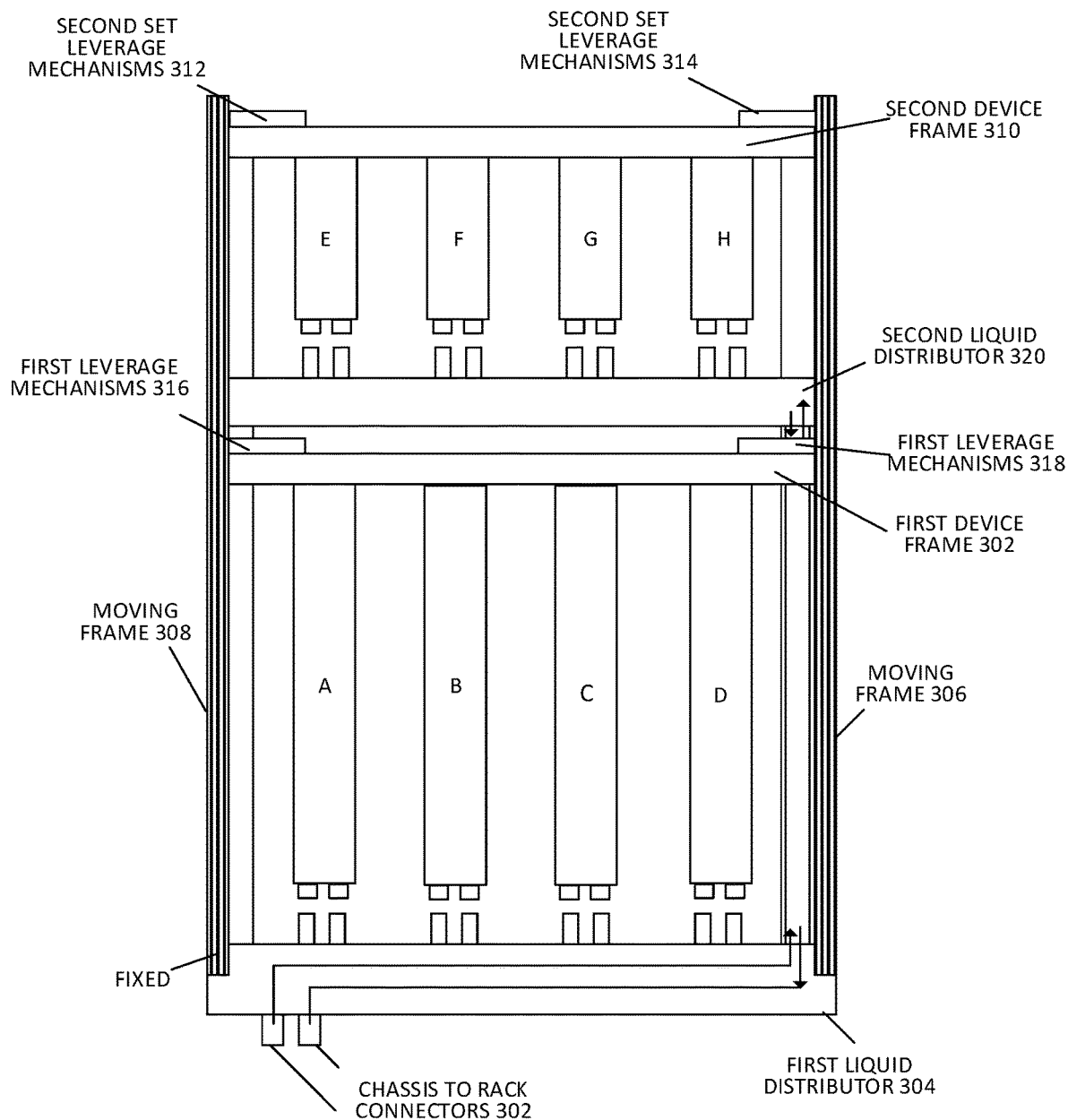
FIG. 3 shows an example chassis with liquid cooling that includes multiple rows of electronic devices, according to some embodiments.

FIG. 3 shows an example chassis with liquid cooling that includes multiple rows of electronic devices, according to some embodiments. A first liquid distributor 304 fluidly connects the devices A, B, C, and D of a first row to the IT rack fluid. Similarly, a second liquid distributor 320 fluidly connects the devices E, F, G, and H of a second row to the IT rack fluid. Pairs of second blind mate connectors (chassis to device connectors) are each dedicated to a respective electronic device. Each pair is fluidly connected to the first blind mate connectors (chassis to rack connectors 302) through the liquid channels of the one or more liquid distributors (e.g., the first liquid distributor 304, and the second liquid distributor 320).

The plurality of devices can occupy a plurality of mounting slots or sockets on one or more device frames (e.g., a first device frame 302 and second device frame 310). Each row is thus formed by a set of the plurality of pairs of second blind mate connectors, a corresponding set of the plurality of mounting slots (and/or devices that occupy those mounting slots). A device frame and corresponding liquid distributor sandwiches each row.

As shown, a second row can be located behind the first row, relative to the direction in which a force is applied to the chassis. As such, the devices in each row will mate with the respective chassis to device connectors in response to a common force, such as pushing of the chassis into the IT rack. The liquid distributors can each be mounted to sliding channels so that when the chassis is pushed into the IT rack, each of the liquid distributors slides toward the devices in their respective row, to cause the mating of the device to the liquid distributors. In other words, by pushing the chassis into the IT rack, multiple rows of electronic devices in the chassis can become fluidly connected to the liquid cooling system of the IT rack.

Further, each row can include a respective leverage mechanism, such as a first leverage mechanisms 316 and 318 that exert a counter-force to the first device frame 302, and a second set of leverage mechanisms 312 and 310 that exert a counter-force to the device frame 310. As mentioned, the counter-force can ensure proper mating force of the blind mate connectors and protect the electrical connections of the devices from lateral force (e.g., sheering). The leverage mechanisms of the different rows can be partially fixed to common moving frames. For example, as shown, the first leverage mechanism 316 (of the first row) and second leverage mechanism 312 (of the second row) can be partially fixed to moving frame 308. Similarly, the first leverage mechanism 318 (of the first row) and the second leverage mechanism 314 (of the second row) can both be partially fixed to the moving frame 306. Other arrangements are also possible. For example, a moving frame can be fixed to the first liquid distributor and the second liquid distributor. A second moving frame can be fixed to second liquid distributor (on the same side as the first moving frame), thereby translating the force from one row to another. Thus, different arrangements of moving frame, liquid distributor, and device frame can be realized.

In some embodiments, different rows can have different length, as shown in FIG. 3. Thus, a chassis can support varying form factors of electronic devices, such as full height full length (FHFL), half height half length (HHHL), full height half length (FHHL), and half height full length (HHFL).

As discussed with regard to FIG. 1A, FIG. 1B, FIG. 2, and FIG. 3, the leverage mechanisms produce an opposing force against the device frame. This opposing force can help to ensure sufficient force to mate the blind mate connectors and stabilize the electronic device during installation.

Figure 4:
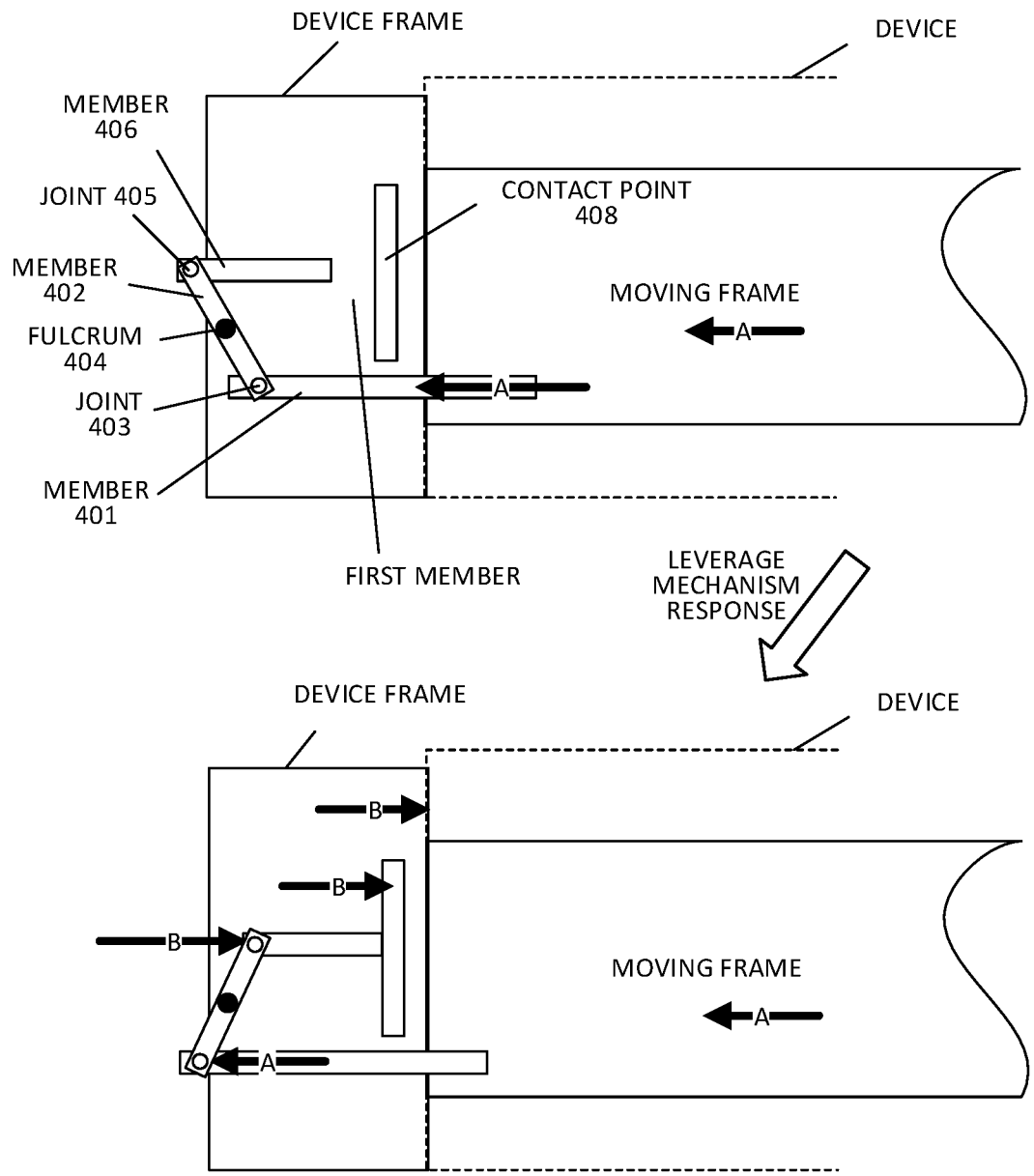
FIG. 4 shows an example of a leverage mechanism of a chassis, according to some embodiments.
Figure 5:
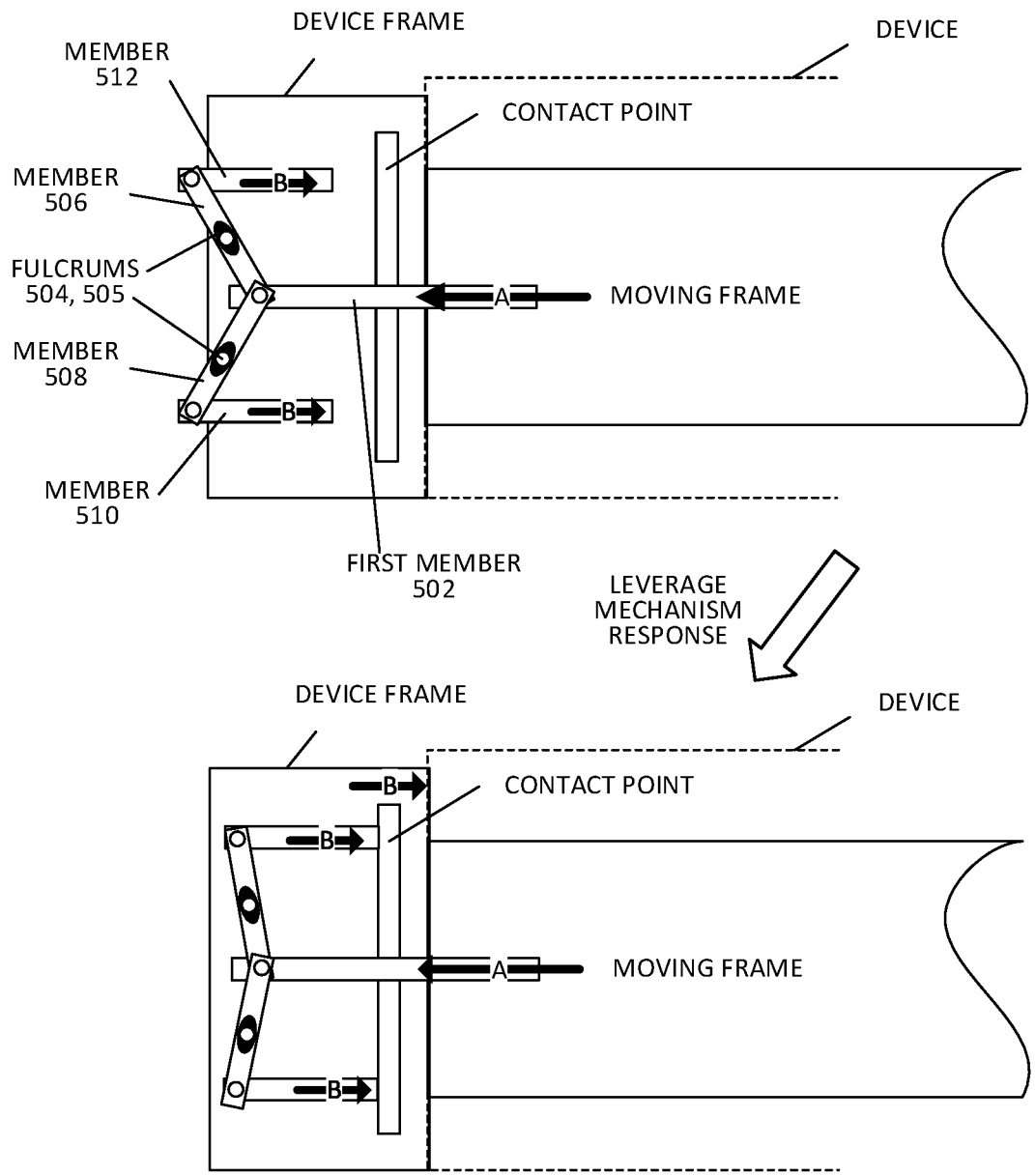
FIG. 5 shows another example of a leverage mechanism of a chassis, according to some embodiments.

FIG. 4 and FIG. 5 show an examples of leverage mechanisms of a chassis, according to some embodiments. Generally, the leverage mechanism can include a first member that is fixed to the moving frame, a second member that is mechanically coupled to the first member (either directly or indirectly), and a fulcrum that interfaces with the second member to pivot the second member in response to the force (from the liquid distributor), to produce the second force (in the direction to the liquid distributor). The fulcrum (or fulcrums) can be fixed to a chassis structure such as the server chassis.

For example, FIG. 4 shows a first member 401 that is fixed to the moving frame. A second member 402 is mechanically coupled to the first member through first joint 403. A fulcrum 404 interfaces with the second member to pivot the second member in response to a force A. This force is initially produced by mating of the first and/or second blind mate connectors to their respective connectors. The force is then transferred through movement of the sliding liquid distributor and the moving frame to the first member of the leverage mechanism. The second member then pivots about the fulcrum to produce the opposing force B.

A third member 406 can be coupled to the second member, e.g., through a joint 405. The third member, which can be fixed to the device frame, can exert the force B against the device frame. For example, the device frame can include a point of contact 408 such as a ledge, an edge, a hook, a wall, or other structural feature that is fixed to or a part of the device frame. The third member can exert the force 'B' on the contact point (the opposing force), thereby supporting the moving device by providing a counter to force 'A'. As mentioned, this opposing force can help ensure sufficient mating force and reduce risk of damage to electrical connectors that connect to the device. It should be noted that the second member and the third member could be substituted with a single arm. This single arm can be straight or have a kink in it. A 'member' can be an arm, a rod, a link, or other sufficiently stiff structure that can transfer force. The leverage mechanism can thus create this opposing force through rotation by one or more of the members.

FIG. 5 shows another example of a leverage mechanism of a chassis, according to some embodiments. The leverage mechanism includes a first member 502 that is fixed to the moving frame. As such, the movement and force 'A' of the moving frame is transferred to the first member. The first member is mechanically coupled to second members 506 and 508. Each of the second members can pivot about respective fulcrums 504, 505, thereby producing a force 'B' in a direction opposite of force 'A'. Third members 512 and 510 are mechanically linked to the second members a side of the second members that is opposite of where the first member couples to the second member. The third members can move in the direction of force 'B' so that the force 'B' is applied to the device frame (e.g., at a contact point of the device frame as described in relation to FIG. 4). It should be understood that numerous variations of the leverage mechanism can be determined with routine test and experimentation, and those shown in FIG. 4 and FIG. 5 are merely examples of such a mechanism.

Figure 6:
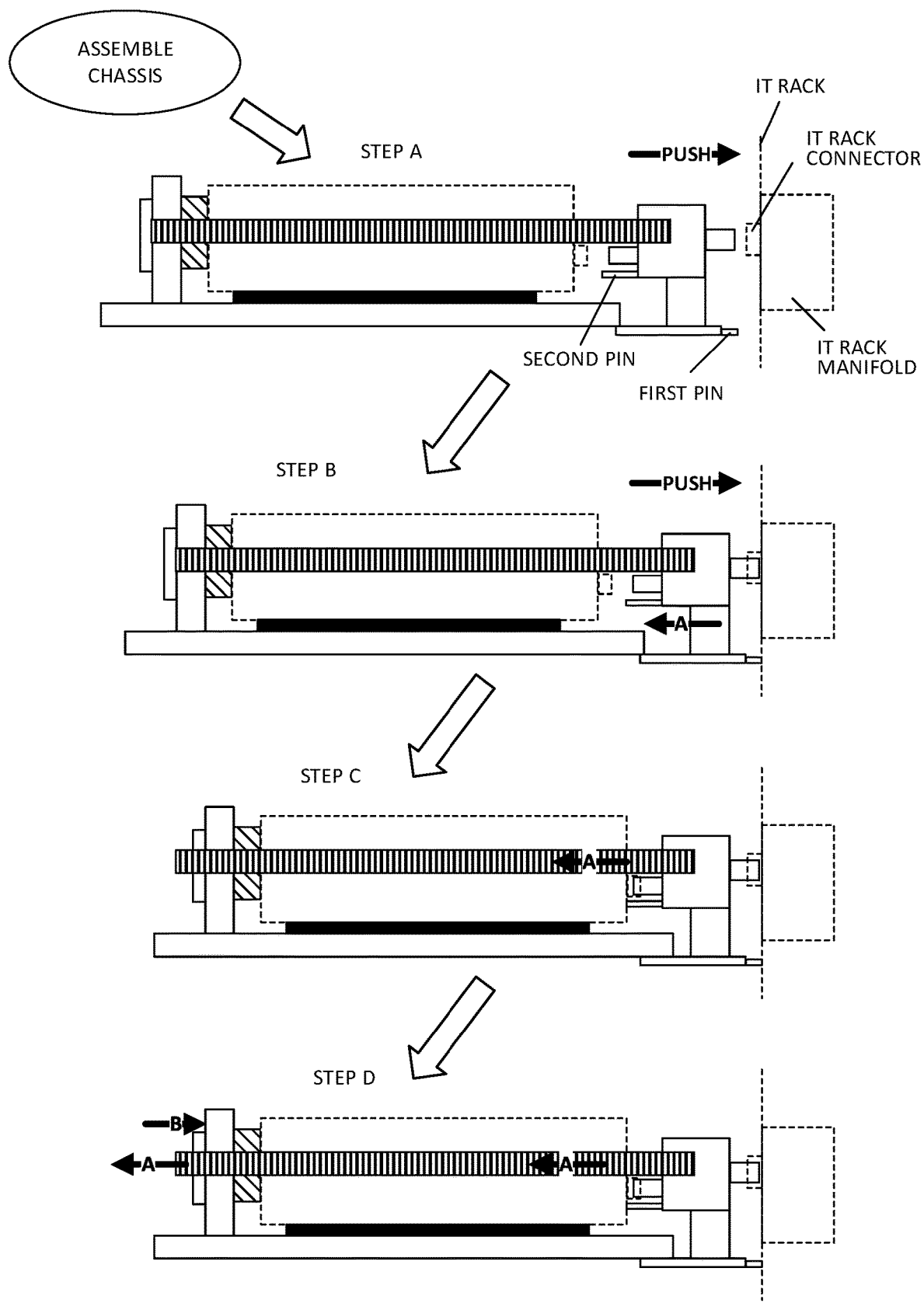
FIG. 6 shows installation of a chassis, according to some embodiments.

FIG. 6 shows installation of a chassis, according to some embodiments. First, the chassis is assembled. This includes installing electronic devices to the chassis. Electrical connectors of the electronic devices are mated to electrical connectors that are attached to the chassis, as described in other sections. Further, the electronic devices are mechanically attached to the chassis through the device frame.

Next, a user can install the chassis onto an IT rack, by pushing the chassis into an IT rack at a dedicated slot of the IT rack. In step A, the first blind mate connectors on the liquid distributor mates with the blind mate connectors on the IT rack as a result of a push force. The push force is in line with the direction in which the first and second blind mate connectors mate.

In step B, as a result of the push force, the IT rack pushes back against the liquid distributor to generate a force 'A' that is opposite of the push force. As described, the liquid distributor is mounted to a sliding channel.

Thus, in step C, the liquid distributor (and second blind mate connectors) are shown to slide towards the electronic device. As a result, the second blind mate connectors are mated with the connectors of the electronic device. The liquid distributor has liquid channels that carries fluid from and to the IT rack to and from the electronic device.

In some embodiments, the device includes a leverage mechanism. As such, in step D, the force 'A' is transferred through the moving frame to the leverage mechanism. The leverage mechanism generates a force 'B' (e.g., through rotation or pivoting about a fulcrum), in response to force 'A', that is exerted against the device frame onto which the device is fixed to. Thus, the leverage mechanism helps ensure that sufficient force is provided to mate the blind mate connectors (through force 'B') and also to stabilize the electronics from the forces produced by pushing the chassis into the IT rack. It should be noted that the same series of steps also applies for chassis that have multiple rows (e.g., as shown in FIG. 3). The same push force will cause mating of blind mate connectors in each row, and the moving frame will transfer the force to respective leverage mechanisms of each row.

In addition, protection pins such as the first pin and the second pin as shown in FIG. 6 can be located alongside the mating of the first blind mate connectors and second blind mate connectors, to reduce the risk of damage during mating of the connectors. The first pin can ensure a minimum distance is kept between the mating connectors of the chassis and the IT rack. Similarly, the second pin can ensure a minimum distance is maintained between the mating connectors of the liquid distributor and the electronic device. As such, the integrity of the blind mate connectors can be preserved to prevent warping, cracking, or leaking.

In such a manner, the chassis can perform blind mating of liquid connectors without any additional operation such as twisting or turning of connectors, or manually connecting individual connections one-by-one. Once the chassis is properly populated to the rack, the fluid from the rack is automatically connected to the electronic devices, without additional labor.

The system design may be used in a multiple layer system, or it can be understood as the design can be used for edge systems built with different from factors. The fluid distribution manifold maybe designed in different manners for different chassis or applications.

Figure 7:
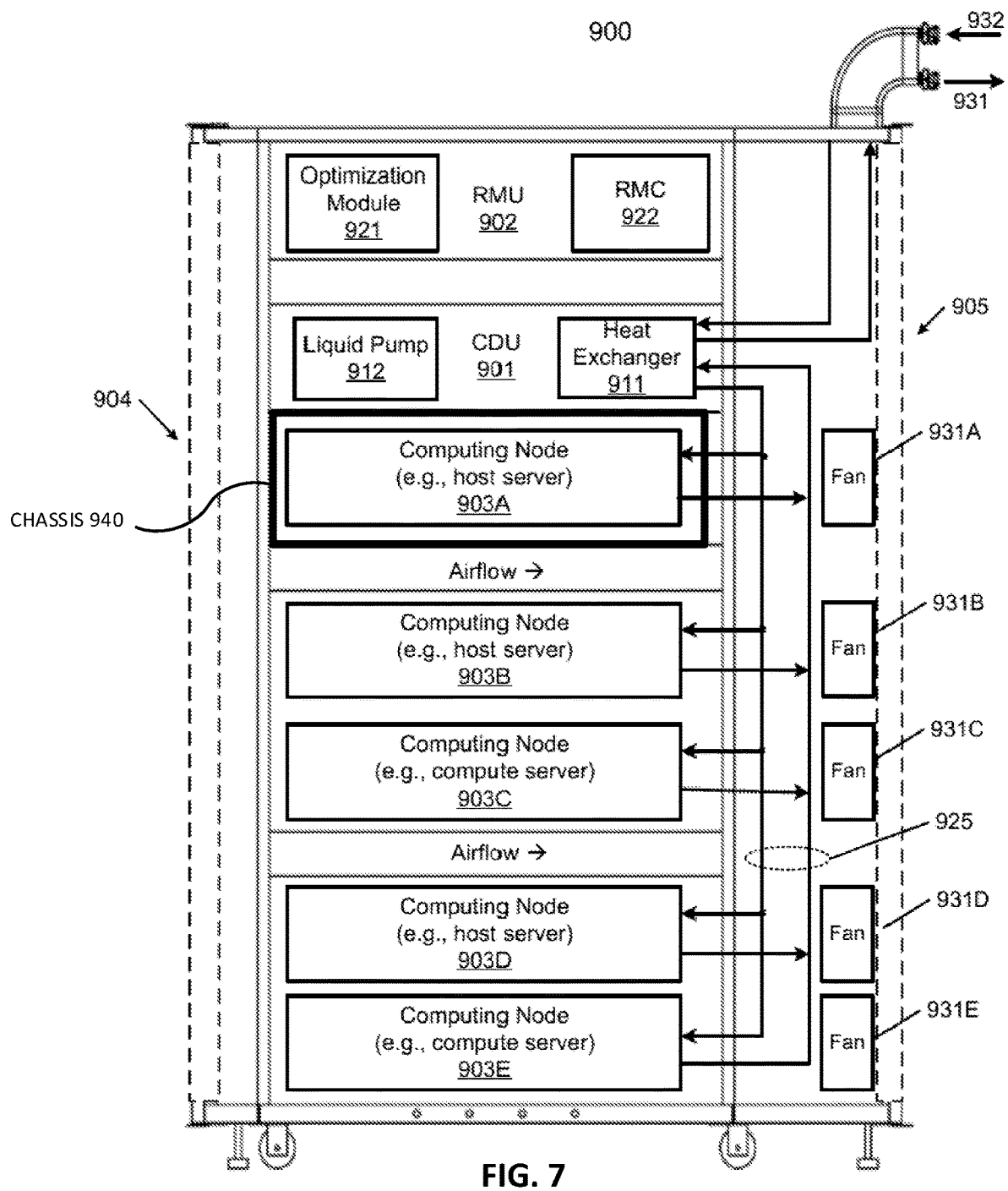
FIG. 7 shows an example of an IT rack and chassis, according to some embodiments.

FIG. 7 is a block diagram illustrating an example of an IT rack having an integrated cooling system, according to some embodiments, however, it should be understood that different variations can be implemented. IT rack 900 may contain one or more servers, each server having one or more processing units attached to a bottom of any of the cooling devices described above. The rack 900 includes, but is not limited to, a cooling system 901, rack management unit (RMU) 902 (optional), and one or more server blades 903A-903D (collectively referred to as server blades 903). Cooling system 901 can be any embodiment of the cooling system described herein. Any of the server blades 903A-903E can be assembled as chassis with attached IT equipment (e.g., main PCB, peripheral devices, PCI-E devices, etc.), as described in other sections. The devices in the chassis are fluidly connected to the liquid system of the IT rack upon installation.

Server blades 903 can be inserted into an array of server slots respectively from frontend 904 or backend 905 of IT rack 900. Note that although there are only five server blades 903A-903E shown here, more or fewer server blades may be maintained within IT rack 900. Also note that the particular positions of cooling system 901, RMU 902, and server blades 903 are shown for the purpose of illustration only; other arrangements or configurations of may also be implemented. Note that rack 900 can be either open to the environment or partially contained by a rack container, as long as the cooling fans can generate airflows from the frontend to the backend.

In addition, for each of the server blades 903, a fan module is associated with the server blade. In this embodiment, fan modules 931A-931E, collectively referred to as fan modules 931, and are associated with server blades 903A-903E respectively. Each of the fan modules 931 includes one or more cooling fans. Fan modules 931 may be mounted on the backends of server blades 903 to generate airflows flowing from frontend 904, traveling through the air space of the sever blades 903, and existing at backend 905 of rack 900.

A condenser of the cooling system 901 can be coupled to external liquid supply/return lines 931-932 to form a primary loop. In some embodiments, if the condenser is external to the IT rack, then the external fluid supply/return lines can connect to ports (e.g., ports 602, 603 as shown in FIG. 8) of the cooling system 901. The connectors coupled to the external liquid supply/return lines 931-932 may be disposed or mounted on backend 905 of the rack 900. In some embodiments, the liquid supply/return lines 931-932 are coupled to a set of room manifolds, which are coupled to an external heat removal system, or external cooling loop. The input and output channels of the cooling system can be coupled to liquid manifold 925 to form a secondary loop, which may include a supply manifold to supply cooling liquid to server blades 903 and a return manifold to return warmer liquid back to the cooling system 901.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server).

The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

IT rack 900 can further include optional RMU 902 configured to provide and manage power supplied to servers 903, fan modules 931, and cooling system 901. RMU 902 may be coupled to a power supply unit (not shown) to manage the power consumption of the power supply unit. The power supply unit may include the necessary circuitry (e.g., an alternating current (AC) to direct current (DC) or DC to DC power converter, backup battery, transformer, or regulator, etc.,) to provide power to the rest of the components of IT rack 900.

In one embodiment, RMU 902 includes optimization module 921 and rack management controller (RMC) 922. RMC 922 may include a monitor to monitor operating status of various components within rack 900, such as, for example, computing nodes 903, cooling system 901, and optional fan modules 931. Specifically, the monitor receives operating data from various sensors representing the operating environments of IT rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of cooling system 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance is adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling.

It should be understood that some features described and shown in the drawings can vary without departing from the scope of the disclosure. For example, the cooling loop design of the cooling facility vary from that shown in the drawings. Further, additional valve or auxiliary units can be added to the cooling system for additional features. Further, different types of valves, e.g., three way valves, can be implemented in the cooling system to achieve the same results. In some embodiments, the controller may adjust opening ratios between completely closed (0%) and completely open (100%) of any of the valves as described herein.

Some embodiments may include a non-transitory machine-readable medium (such as microelectronic memory) having stored thereon instructions, which program one or more data processing components (generically referred to here as a "processor") to perform valve control operations, such as determining which mode to operate in, and/or deriving evaporation rate and/or rate of condensation. In some aspects, the rate of condensation is configurable (e.g., it is stored as a setting in computer readable memory). In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A chassis for packaging electronics to be populated on an information technology (IT) rack, the chassis comprising:
    a liquid distributor having first blind mate connectors facing a first direction and second blind mate connectors, facing away from the first direction, wherein the first blind mate connectors are to be coupled to a rack manifold of an electronic rack to receive cooling fluid, to distribute the cooling fluid to an electronic device via the second blind mate connectors, and to return the cooling fluid carrying heat generated from the electronic device back to the rack manifold;
    a sliding channel of the chassis that the liquid distributor is mounted to, such that the liquid distributor slides back and forth along the first direction; and
    a device frame having a mounting slot to receive the electronic device deposited thereon, such that the second blind mate connectors slide towards the mounting slot when a first force is applied to the first blind mate connectors against the first direction.

2. The chassis of claim 1, further comprising:
    a moving frame, fixed to the liquid distributor, that slides back and forth along the first direction due to corresponding movement of the liquid distributor; and
    a leverage mechanism that is fixed to the moving frame, that provides a second force against the device frame in response to the first force that is applied to the first blind mate connectors against the first direction.

3. The chassis of claim 2, wherein the leverage mechanism includes a first member fixed to the moving frame, a second member that is coupled to the first member, a fulcrum that interfaces with the second member to pivot the second member in response to the first force, to produce the second force.

4. The chassis of claim 1, wherein
    the first blind mate connectors and the second blind mate connectors are fluidly connected via two or more liquid channels,
    a first of the first blind mate connectors is fluidly connected to a first of the second blind mate connectors to distribute liquid from the first of the first blind mate connectors to the first of the second blind mate connectors, and
    a second of the first blind mate connectors is fluidly connected to a second of the second blind mate connectors to return liquid from the second of the second blind mate connectors to the second of the first blind mate connectors.

5. The chassis of claim 1, wherein the chassis is a hose-less liquid cooling chassis.

6. The chassis of claim 1, wherein each of the first blind mate connectors and each of the second blind mate connectors includes a guiding member and a locking member that mates each to a respective connector by applying force to the chassis in the first direction.

7. The chassis of claim 1, wherein the second blind mate connectors comprise a plurality of pairs of second blind mate connectors that are fluidly connected to the first blind mate connectors, and wherein the device frame includes a plurality of mounting slots for attaching a plurality of electronic devices.

8. The chassis of claim 7, wherein a first set of the plurality of pairs of second blind mate connectors and a first portion of the plurality of mounting slots form a first row, and a second set of the plurality of pairs of second blind mate connectors and a second portion of the plurality of mounting slots form a second row behind the first row.

9. The chassis of claim 1, wherein the electronic device is a PCIE device, and an electronic connector that is attached to the chassis mates to the PCIE device in a direction that is perpendicular to a mating direction of the first blind mate connectors and second blind mate connectors.

10. The chassis of claim 1, wherein the sliding channel includes rail, a channel, or a member that slides through the rail or the channel.

11. An electronic rack, comprising:
    a rack manifold to receive and to return cooling fluid from and to an external cooling source; and
    a plurality of server chassis arranged in a stack, each server chassis containing at least one server, wherein each server chassis comprises:
        a liquid distributor having first blind mate connectors facing a first direction and second blind mate connectors, facing away from the first direction, wherein the first blind mate connectors are coupled to the rack manifold to receive cooling fluid, to distribute the cooling fluid to an electronic device via the second blind mate connectors, and to return the cooling fluid carrying heat generated from the electronic device back to the rack manifold,
        a sliding channel of the chassis that the liquid distributor is mounted to, such that the liquid distributor slides back and forth along the first direction, and
        a device frame having a mounting slot to receive the electronic device deposited thereon, such that the second blind mate connectors slide towards the mounting slot when a first force is applied to the first blind mate connectors against the first direction.

12. The electronic rack of claim 11, wherein each server chassis further comprises:
    a moving frame, fixed to the liquid distributor, that slides back and forth along the first direction due to corresponding movement of the liquid distributor; and
    a leverage mechanism that is fixed to the moving frame, that provides a second force against the device frame in response to the first force that is applied to the first blind mate connectors against the first direction.

13. The electronic rack of claim 12, wherein the leverage mechanism includes a first member fixed to the moving frame, a second member that is coupled to the first member, a fulcrum that interfaces with the second member to pivot the second member in response to the first force, to produce the second force.

14. The electronic rack of claim 11, wherein
the first blind mate connectors and the second blind mate connectors are fluidly connected via two or more liquid channels,
a first of the first blind mate connectors is fluidly connected to a first of the second blind mate connectors to distribute liquid from the first of the first blind mate connectors to the first of the second blind mate connectors, and
a second of the first blind mate connectors is fluidly connected to a second of the second blind mate connectors to return liquid from the second of the second blind mate connectors to the second of the first blind mate connectors.

15. The electronic rack of claim 11, wherein the chassis is a hose-less liquid cooling chassis.

16. The electronic rack of claim 11, wherein each of the first blind mate connectors and each of the second blind mate connectors includes a guiding member and a locking member that mates each to a respective connector by applying force to the chassis in the first direction.

17. The electronic rack of claim 11, wherein the second blind mate connectors comprise a plurality of pairs of second blind mate connectors that are fluidly connected to the first blind mate connectors, and wherein the device frame includes a plurality of mounting slots for attaching a plurality of electronic devices.

18. The electronic rack of claim 17, wherein a first set of the plurality of pairs of second blind mate connectors and a first portion of the plurality of mounting slots form a first row, and a second set of the plurality of pairs of second blind mate connectors and a second portion of the plurality of mounting slots form a second row behind the first row.

19. The electronic rack of claim 11, wherein the electronic device is a PCIE device, and an electronic connector that is attached to the chassis mates to the PCIE device in a direction that is perpendicular to a mating direction of the first blind mate connectors and second blind mate connectors.

20. The electronic rack of claim 11, wherein the sliding channel includes rail, a channel, or a member that slides through the rail or the channel.

\* \* \* \* \*